United States Patent
Motohashi et al.

(10) Patent No.: US 9,474,174 B2
(45) Date of Patent: Oct. 18, 2016

(54) ELECTRONIC APPARATUS

(71) Applicant: KYOCERA Corporation, Kyoto-shi, Kyoto (JP)

(72) Inventors: Koji Motohashi, Daito (JP); Toshimitsu Matsuura, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/675,394

(22) Filed: Mar. 31, 2015

(65) Prior Publication Data

US 2015/0342066 A1    Nov. 26, 2015

Related U.S. Application Data

(63) Continuation of application No. PCT/JP2014/005529, filed on Oct. 31, 2014.

(30) Foreign Application Priority Data

May 21, 2014   (JP) ................. 2014-105094
Sep. 22, 2014  (JP) ................. 2014-192601

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 5/02* | (2006.01) | |

(Continued)

(52) U.S. Cl.
CPC ........... *H05K 5/0217* (2013.01); *H04M 1/185* (2013.01); *H05K 5/03* (2013.01); *H05K 5/04* (2013.01); *H04M 1/0266* (2013.01); *H04M 1/23* (2013.01)

(58) Field of Classification Search
CPC ...................................... G06F 1/1626
USPC ............. 361/679.21–679.3, 679.56; 455/575.1–575.9
See application file for complete search history.

(56) References Cited

U.S. PATENT DOCUMENTS 7,385,482 B2 * 6/2008 Wada ............. H04R 1/028
                                            340/384.1
9,261,915 B2 * 2/2016 Uto ............... G06F 1/1605
                                            379/419

(Continued)

FOREIGN PATENT DOCUMENTS

JP    2007-171738    7/2004
JP    2006-237948 A  9/2006

(Continued)

OTHER PUBLICATIONS

International Search Report and Written Opinion of the International Searching Authority issued by Japan Patent Office for International Application No. PCT/JP2014/005529.

(Continued)

*Primary Examiner* — Anthony Haughton
(74) *Attorney, Agent, or Firm* — Procopio Cory Hargreaves and Savitch LLP

(57) ABSTRACT

A cover panel is located on a surface of an electronic apparatus, and includes at least one through-hole and is made of sapphire. A panel support member includes a plate part, support parts, and a reinforcing part. The plate part is opposed to the cover panel. The support parts are vertically arranged on both sides of the plate part and support the cover panel. The reinforcing part is located in the plate part and reinforces the plate part. An operation button passes through the through-hole.

12 Claims, 13 Drawing Sheets

(51) Int. Cl.
  *H05K 5/03* (2006.01)
  *H05K 5/04* (2006.01)
  *H04M 1/18* (2006.01)
  *H04M 1/02* (2006.01)
  *H04M 1/23* (2006.01)

(56) References Cited

U.S. PATENT DOCUMENTS

| | | |
|---|---|---|
| 2008/0004083 A1 | 1/2008 | Ohki et al. |
| 2013/0307818 A1* | 11/2013 | Pope ................. G06F 3/044 345/174 |
| 2015/0005036 A1 | 1/2015 | Horii |
| 2015/0036864 A1 | 2/2015 | Ozasa et al. |
| 2015/0071509 A1* | 3/2015 | Myers ............ G06K 9/00053 382/124 |
| 2015/0280767 A1* | 10/2015 | Ames .................... B23K 26/10 455/575.8 |
| 2015/0304463 A1* | 10/2015 | Rynk .................... H04M 1/026 455/575.1 |

FOREIGN PATENT DOCUMENTS

| | | |
|---|---|---|
| JP | 2013-141147 | 7/2013 |
| JP | 2013-243622 A | 12/2013 |
| WO | 2006/038499 A1 | 4/2006 |
| WO | 2013/175761 A1 | 11/2012 |

OTHER PUBLICATIONS

Office Action dated Apr. 5, 2016 issued in counterpart Japanese Patent Application No. 2015-083076.

* cited by examiner

ELECTRONIC APPARATUS

CROSS-REFERENCE TO RELATED APPLICATION

The present application is based on PCT Application No. PCT/JP2014/005529, filed on Oct. 31, 2014, which claims the benefit of Japanese Application No. 2014-105094, filed on May 21, 2014 and Japanese Application No. 2014-192601, filed on Sep. 22, 2014. PCT Application No. PCT/JP2014/005529, Japanese Application No. 2014-105094 and Japanese Application No. 2014-192601 are entitled "ELECTRONIC APPARATUS". The contents of which are incorporated by reference herein in their entirety.

FIELD

Embodiments of the present disclosure relate to an electronic apparatus.

BACKGROUND

A mobile phone includes a Liquid Crystal Display (LCD) unit. Provided on a surface on the viewing side of the LCD unit is a cover panel for protecting the surface.

SUMMARY

An apparatus is disclosure. In one embodiment, an electronic apparatus includes a cover panel, a panel support member and an operation button. A cover panel is located on a surface of the electronic apparatus. The cover panel has at least one of through-holes, and is made of sapphire. The panel support member includes a plate part, support parts and a reinforcing part. The plate part is opposed to the cover panel. The support parts are vertically arranged on both sides of the plate part and support the cover panel. The reinforcing part is located in the plate part and reinforces the plate part. The operation button passes through the through-hole.

These and other objects, features, aspects and advantages of the present invention will become more apparent from the following detailed description of the present invention when taken in conjunction with the accompanying drawings.

DETAILED DESCRIPTION

Embodiment

<External Appearance of Electronic Apparatus>

Figure 1:
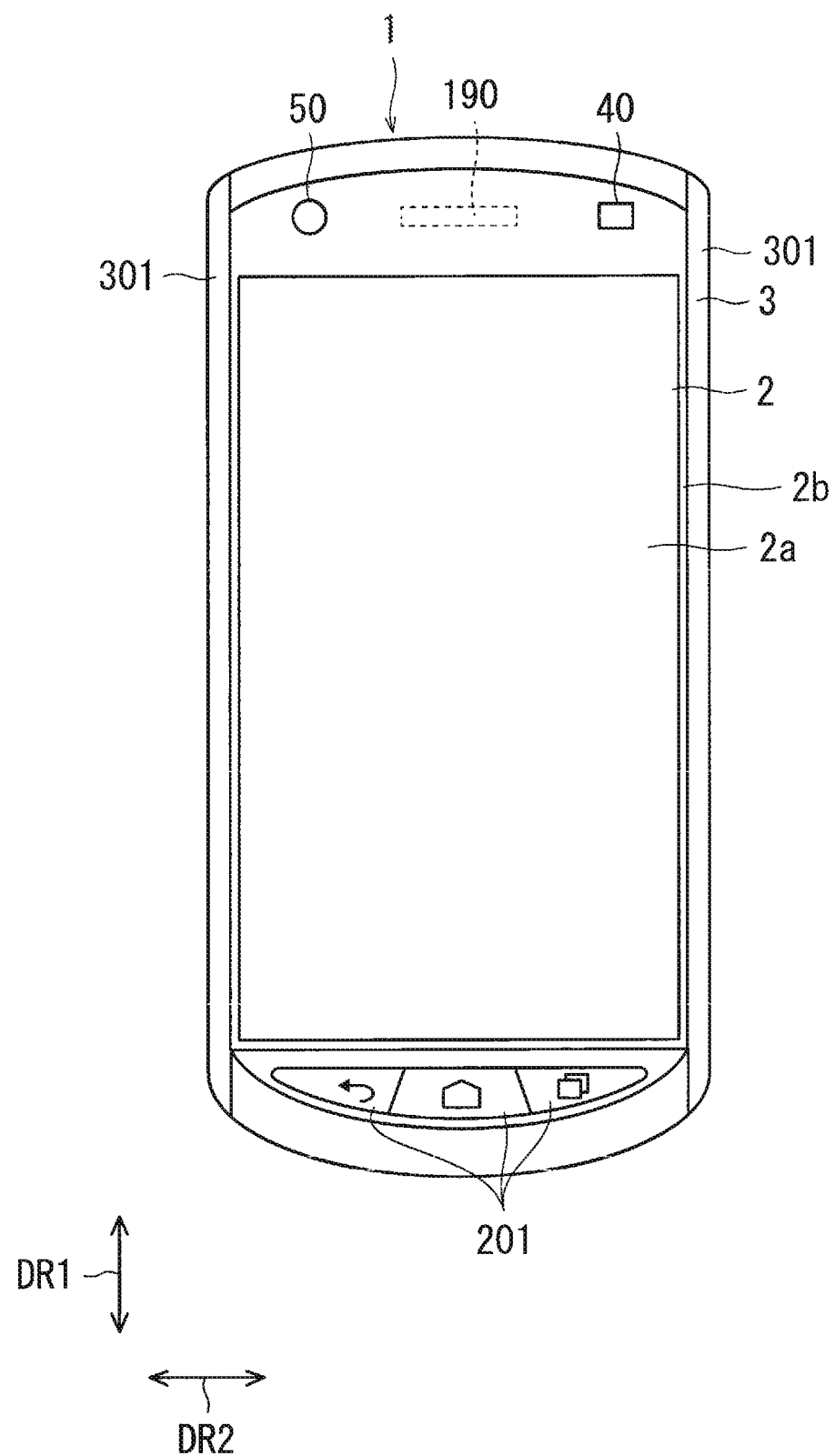
FIG. 1 is a front view illustrating an example of a conceptual configuration of an electronic apparatus.

FIG. 1 is a front view illustrating an external appearance of an electronic apparatus 1 according to an example embodiment. The electronic apparatus 1 according to an example embodiment is, for example, a mobile phone such as a smartphone.

Figure 2:
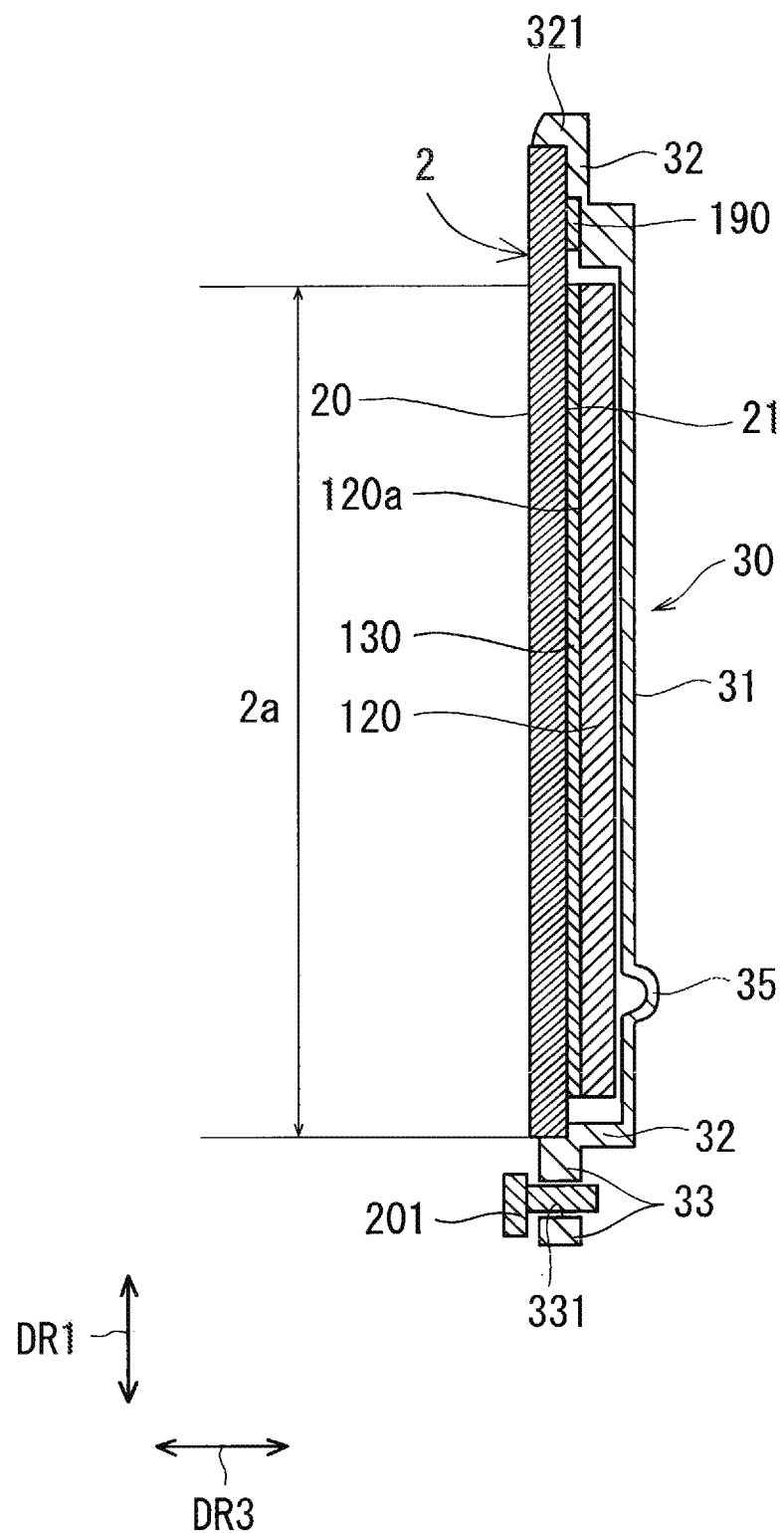
FIG. 2 is a cross-sectional view illustrating an example of a conceptual configuration of a cover panel, a touch panel, a display panel, and a panel support member.

As illustrated in FIG. 1, the electronic apparatus 1 has a plate shape substantially rectangular in a plan view. The electronic apparatus 1 includes a transparent cover panel 2 and a case 3 that supports the cover panel 2. FIG. 2 is a cross-sectional view illustrating a conceptual configuration of the cover panel 2, a panel support member 30, a display panel 120, and a touch panel 130, which will be described below. FIG. 2 is a view for describing the panel support member 30 described below in detail and, for visibility, does not illustrate other components. FIG. 2 illustrates the configuration in a cross section including a longitudinal direction DR1. As illustrated in FIG. 2, the cover panel 2 covers a display surface 120a of the display panel 120.

The cover panel 2 is disposed on the surface of the electronic apparatus 1, specifically, on the front surface of the electronic apparatus 1. The cover panel 2 is arranged on a portion other than an edge area, for example, a peripheral edge, of the front surface of the electronic apparatus 1.

The cover panel 2 has, for example, a plate shape, and an approximately rectangular shape in a plan view. Referring to FIG. 2, the cover panel 2 includes a first surface 20 constituting a portion of the front surface of the electronic apparatus 1 and a second surface 21 that is positioned on the opposite side to the first surface 20 and faces the display surface 120a of the display panel 120. Hereinafter, the first surface 20 is also referred to as an "outer surface 20" and the second surface 21 is also referred to as an "inner surface 21." In addition, the cover panel 2 may be a plane panel having a planar shape or a curved panel having a curved shape.

The cover panel 2 is made of, for example, sapphire. Here, sapphire refers to a single crystal containing alumina ($Al2O3$) as a main component, which is a single crystal whose purity of Al2O3 is approximately greater than or equal to 90% in the present specification. The purity of Al2O3 is preferably greater than or equal to 99% which provides a resistance to damage of the cover panel and a reduction of cracks or chipping. Besides, examples of the material for the cover panel 2 may include diamond, zirconia, titania, crystal, lithium tantalate, and aluminum oxynitride. These are preferably single crystal materials whose purity is approximately greater than or equal to 90% which provides a resistance to damage of the cover panel and a reduction of cracks or chipping. Examples of the "cover panel made of sapphire" include a cover panel formed of a glass panel and a sapphire panel bonded to each other as well as a cover panel made of elemental sapphire.

In an example embodiment, the cover panel 2 is a panel of a one-layer structure having a layer made of sapphire which is disposed on the surface of the electronic apparatus 1. Alternatively, the cover panel 2 may be a composite panel (laminated panel) of a multilayer structure having such a layer. For example, the cover panel 2 may be a composite panel of a two-layered structure configured of a layer (sapphire panel) made of sapphire which is disposed on the surface of the electronic apparatus 1 and a layer (glass panel) made of glass which is attached to the layer. In addition, the cover panel 2 may be a composite panel of a three-layered structure configured of a layer (sapphire panel) made of sapphire which is disposed on the surface of the electronic apparatus 1, a layer (glass panel) made of glass which is attached to the layer made of sapphire, and a layer (sapphire panel) made of sapphire which is attached to the layer made of glass. Further, the cover panel 2 may include a layer made of crystalline materials other than sapphire such as diamond, zirconia, titania, crystal, lithium tantalite, and aluminum oxynitride.

The cover panel 2 includes a transparent and/or light transmissive display portion 2a (also referred to as a display window) transmitting the display of the display panel 120. The display portion 2a has, for example, a rectangular shape in a plan view. The visible light output from the display panel 120 passes through the display portion 2a and is emitted to the outside of the electronic apparatus 1. A user visually recognizes information displayed on the display panel 120 through the display portion 2a from the outside of the electronic apparatus 1.

A portion of a peripheral end 2b that surrounds the display portion 2a in the cover panel 2 is opaque and/or not transparent because of, for example, a film or the like that is attached thereto. Accordingly, the portion of the peripheral end 2b is a non-display portion that does not transmit the display of the display panel 120.

The case 3 has an approximately square shape with one surface that is partially opened. The case 3 of the electronic apparatus 1 includes a peripheral end of a front surface, a side surface, and a rear surface. The case 3 is formed of, at least one of a resin and a metal. The resin forming the case 3 may be, for example, a polycarbonate resin, an acrylonitrile butadiene styrene (ABS) resin, or a nylon-based resin. A metal forming the case 3 may be, for example, aluminum. The case 3 may be configured of only one material or a combination of materials.

As illustrated in FIG. 2, the touch panel 130 is attached to the inner surface 21 of the cover panel 2. The display panel 120 which is a display unit is attached to the surface on the opposite side to the inner surface 21 of the touch panel 130. That is, the display panel 120 is installed on the inner surface 21 of the cover panel 2 with the touch panel 130 therebetween. A portion of the cover panel 2 facing the display panel 120 is the display portion 2a. The user can provide various instructions to the electronic apparatus 1 by operating the display portion 2a of the cover panel 2 using a finger or the like.

An operation unit 200, described below, includes an operation button 201 that is disposed inside of the case 3. The surface of the operation button 201 is exposed from the lower end of the outer surface of the cover panel 2. A proximity sensor 140, a front imaging unit 160, a rear imaging unit 170, and a piezoelectric vibrating element 190, described below, are provided in the case 3. As illustrated in FIG. 2, the piezoelectric vibrating element 190 is attached to the inner surface 21 of the cover panel 2 with an adhesive material. The adhesive material may be, for example, a double-sided tape or an adhesive.

The operation button 201 may be, for example, glass or resin. Other materials that may be used for the operation button 201 include crystalline materials such as sapphire, diamond, zirconia, titania, crystal, lithium tantalite, and aluminum oxynitride.

A first transparent portion 40 on the proximity sensor is provided at an upper end of the cover panel 2, through which the proximity sensor 140 in the case 3 is visually recognized from the outside of the electronic apparatus 1. In addition, a second transparent portion 50 on the front surface is provided at the upper end of the cover panel 2, through which an imaging lens of the front imaging unit 160 in the case 3 is visually recognized from the outside of the electronic apparatus 1.

A third transparent portion for rear surface (not illustrated) is provided on the rear surface of the electronic apparatus 1, through which an imaging lens of the rear imaging unit 170 in the case 3 is visually recognized from the outside of the electronic apparatus 1. Speaker holes (not illustrated) are provided on the rear surface of the electronic apparatus 1.

The cover panel 2 is attached to the case 3 with an adhesive material. The adhesive material may be, for example, a double-sided tape or an adhesive. The inner surface 21 of the cover panel 2 is accordingly supported by the case 3. Here, the case 3 is a combination of a plurality of members, and the cover panel 2 is supported by one of those members, for example, by the panel support member 30 (FIG. 2).

<Electrical Configuration of Electronic Apparatus>

Figure 3:
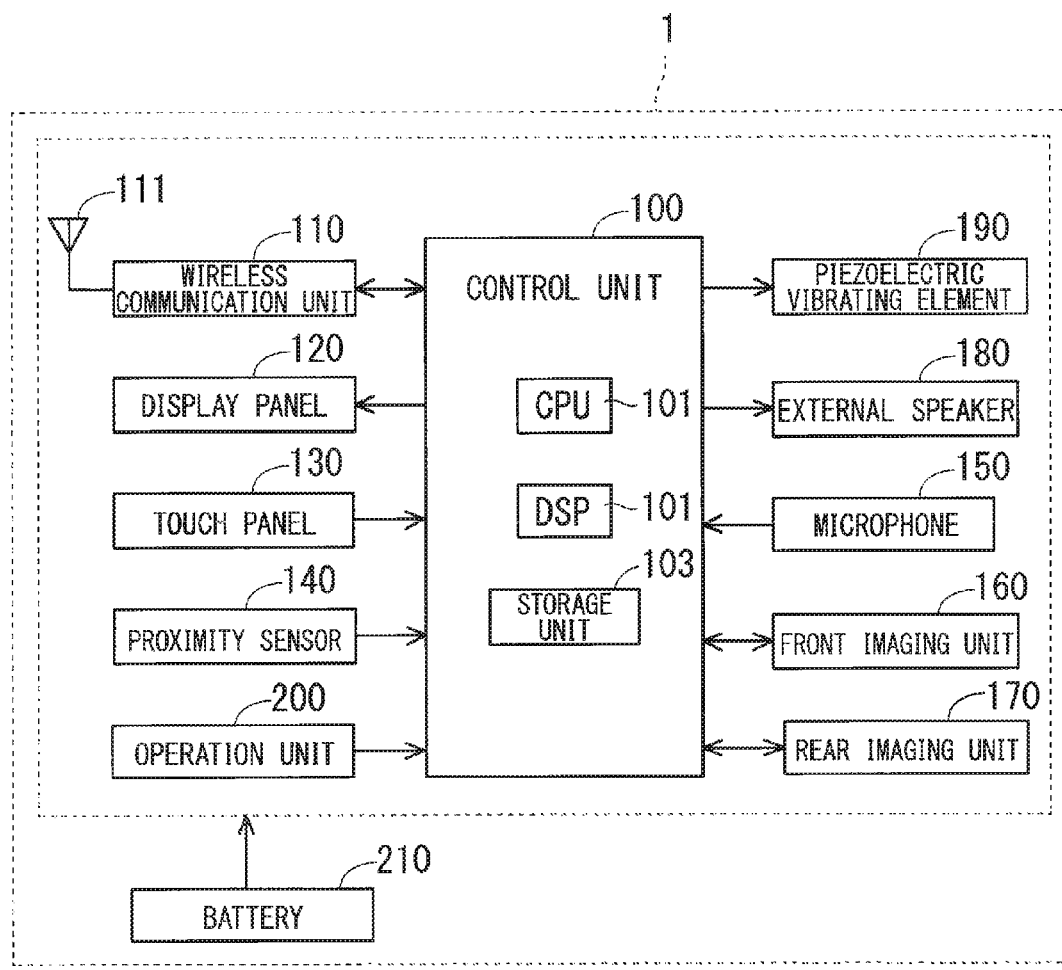
FIG. 3 is a block diagram schematically illustrating an example of an electrical configuration of the electronic apparatus.

FIG. 3 is a block diagram mainly illustrating an electrical configuration of the electronic apparatus 1. As illustrated in FIG. 3, the electronic apparatus 1 includes a control unit 100, a wireless communication unit 110, the display panel 120, the touch panel 130, the proximity sensor 140, and a microphone 150. Further, the electronic apparatus 1 includes the front imaging unit 160, the rear imaging unit 170, an external speaker 180, the piezoelectric vibrating element 190, the operation unit 200, and a battery 210. There elements are accommodated in the case 3.

The control unit 100 includes a Central Processing Unit (CPU) 101, a Digital Signal Processor (DSP) 102, and a storage unit 103. The control unit 100 manages the overall operation of the electronic apparatus 1 by controlling other elements of the electronic apparatus 1.

The storage unit 103 is a recording medium which is non-transitory and is readable by the control unit 100 (CPU 101 and DSP 102) such as a Read Only Memory (ROM) and a Random Access Memory (RAM). A main program, a plurality of application programs, and the like, which are control programs for controlling the electronic apparatus 1, specifically, for controlling respective elements such as the wireless communication unit 110, the display panel 120, and the like, are stored in the storage unit 103. Various functions of the control unit 100 can be realized by the CPU101 and the DSP102 executing various programs in the storage unit 103.

Further, in addition to the ROM and the RAM, the storage unit 103 may include a non-transitory recording medium, which is readable by a computer. The storage unit 103 may include a compact hard disk drive and a Solid State Drive (SSD).

The wireless communication unit 110 includes an antenna 111. In the wireless communication unit 110, the antenna 111 receives a signal from a mobile phone different from the electronic apparatus 1, or from a communication device such as a web server connected to the Internet via a base station. The wireless communication unit 110 performs an amplification process and down conversion on the received signal and outputs the signal to the control unit 100. The control unit 100 performs demodulation processing or the like on the input signal, and acquires a sound signal (sound information) indicating a voice or music included in the received signal.

Further, the wireless communication unit 110 performs up-converting and the amplification process on a transmission signal including a sound signal or the like generated in the control unit 100, and transmits the transmission signal after the process from the antenna 111 in a wireless manner. The transmission signal from the antenna 111 is received in a communication device connected to the Internet or a mobile phone different from the electronic apparatus 1 via the base station.

The display panel 120 is, for example, a liquid crystal display panel or an organic electro luminescent (EL) panel. The display panel 120 displays various pieces of information such as characters, symbols, and figures by control of the control unit 100. The information displayed in the display panel 120 can be visually recognized by the user of the electronic apparatus 1 through the display portion 2a of the cover panel 2.

The touch panel 130 is, for example, a projection type electrostatic capacitance touch panel in a form of a sheet. The touch panel 130 detects contact of an object with respect to the display portion 2a of the cover panel 2, and outputs a detection signal according to the detected contact. The touch panel 130 is attached to the inner surface 21 of the cover panel 2. The control unit 100 specifies the contents of an operation performed on the display portion 2a of the cover panel 2 based on the detection signal output from the touch panel 130, and performs an operation according to the specified contents.

The proximity sensor 140 is, for example, an infrared type proximity sensor. The proximity sensor 140 outputs a detection signal when an object approaches the proximity sensor 140 within a predetermined distance. The detection signal is input to the control unit 100. When the control unit 100 receives the detection signal from the proximity sensor 140, for example, the control unit 100 stops a function of detecting an operation of the touch panel 130.

The front imaging unit 160 includes an imaging leans, an imaging element, and the like. The front imaging unit 160 images a still image and a moving image based on the control by the control unit 100. The imaging lens of the front imaging unit 160 can be visually recognized from the second transparent portion 50 on the front surface of the electronic apparatus 1. Therefore, the front imaging unit 160 can image an object in front of the surface (on the cover panel 2 side) of the electronic apparatus 1.

The rear imaging unit 170 includes an imaging lens, an imaging element, and the like. The rear imaging unit 170 images a still image and a moving image based on the control by the control unit 100. The imaging lens of the rear imaging unit 170 can be recognized from the third transparent portion on the rear surface of the electronic apparatus 1. Therefore, the rear imaging unit 170 can image an object in front of the rear surface side of the electronic apparatus 1.

The microphone 150 outputs a sound from the outside of the electronic apparatus 1 to the control unit 100 by converting the sound into an electric sound signal. The sound from the outside of the electronic apparatus 1 is received by the microphone 150 through microphone holes (not illustrated) configured on the surface of the electronic apparatus 1.

The external speaker 180 is, for example, a dynamic speaker. The external speaker 180 converts the electric sound signal from the control unit 100 into a sound and then outputs the sound. The sound output from the external speaker 180 is output from the speaker holes configured on the rear surface of the electronic apparatus 1. The volume of the sound output from the speaker holes is set to a degree such that the sound can be heard at a location separated from the electronic apparatus 1.

The piezoelectric vibrating element 190 is attached to the inner surface 21 of the cover panel 2 disposed on the front surface of the electronic apparatus 1 with an adhesive material, as described above. The piezoelectric vibrating element 190 is vibrated by a drive voltage provided from the control unit 100. The control unit 100 generates a drive voltage based on a sound signal, and provides the drive voltage to the piezoelectric vibrating element 190. The piezoelectric vibrating element 190 is vibrated by the control unit 100 based on a sound signal, vibrating the cover panel 2 based on the sound signal. A reception sound is accordingly transmitted from the cover panel 2 to the user. The volume of the reception sound is set to a degree such that the user can hear the sound when moving the cover panel 2 close to an ear. An example of a specific structure of the piezoelectric vibrating element 190 and the transmission of a reception sound will be described below in detail.

In an example embodiment, the piezoelectric vibrating element 190 is not necessarily required to transmit the communication sound. Alternatively, a normal dynamic receiver may be provided.

The operation unit 200 includes the operation buttons 201 and a switch (not illustrated), and detects an operation on the operation button 201. In the operation unit 200, when the operation button 201 is pressed (operated), the switch turns on. When the switch turns on, the operation unit 200 outputs, to the control unit 100, an on-signal indicating that the operation button 201 has been operated. Meanwhile, in the case where the operation button 201 is not operated and the switch turns off, the operation unit 200 outputs, to the control unit 100, an off-signal indicating that the operation button 201 has not been operated. The control unit 100 judges the presence/absence of the operation on the operation button 201 based on an on-signal and an off-signal input from the operation unit 200, and then performs the operation according to the judgment results.

The battery 210 outputs the power for the electronic apparatus 1. The power output from the battery 210 is supplied to the respective electronic components such as the control unit 100 and the wireless communication unit 110 of the electronic apparatus 1.

<Panel Support Member>

Figure 4:
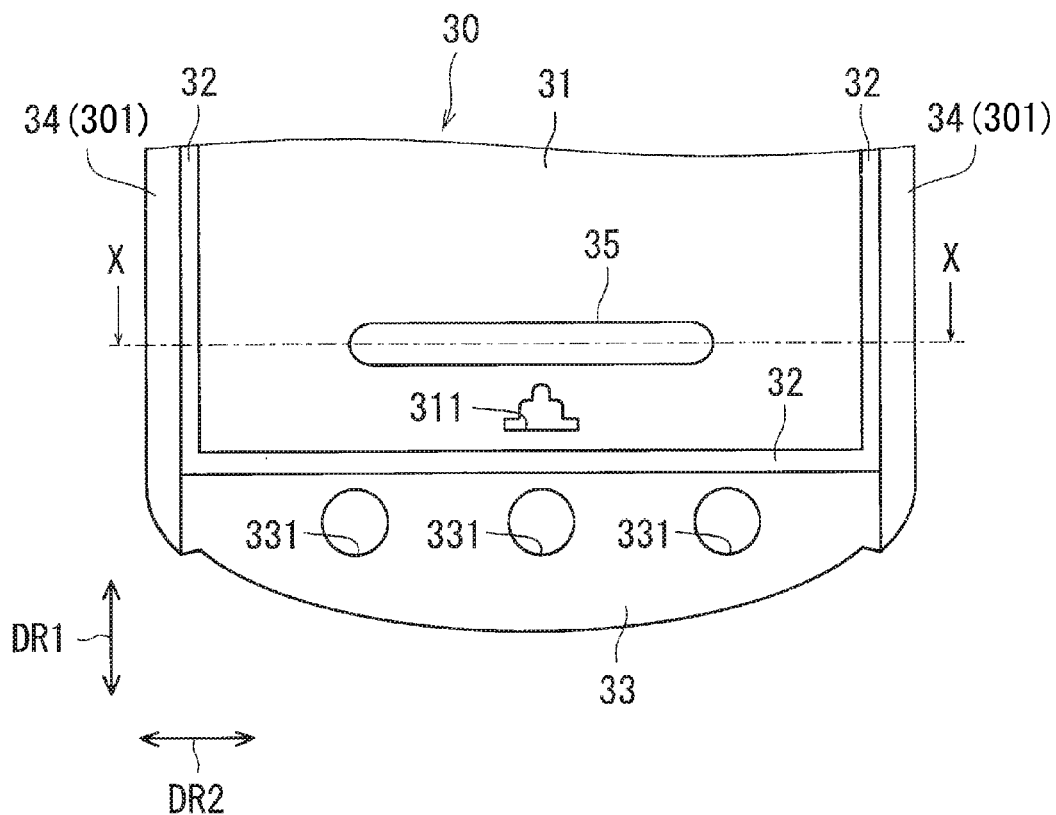
FIG. 4 is a plan view illustrating an example of a conceptual configuration of the panel support member.
Figure 5:
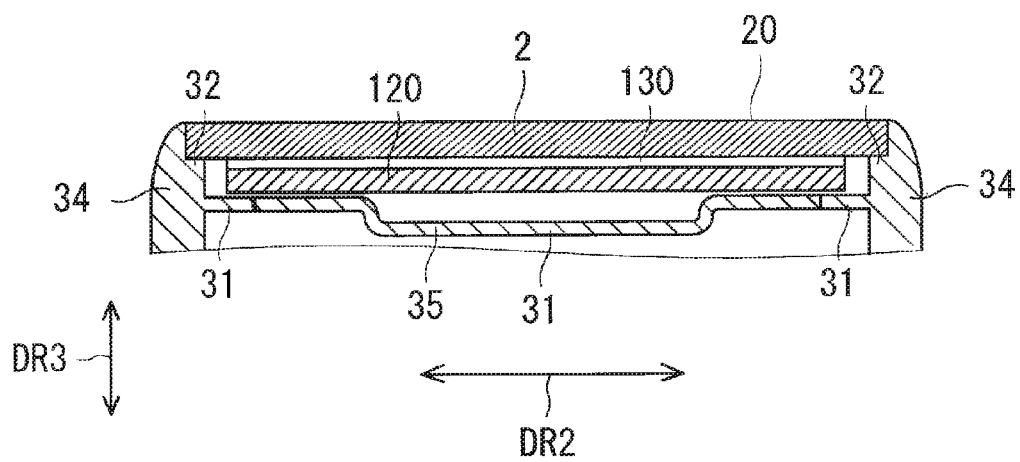
FIG. 5 is a cross-sectional view illustrating an example of a conceptual configuration of the cover panel, the touch panel, the display panel, and the panel support member.

The electronic apparatus 1 includes the panel support member 30. FIGS. 4 and 5 illustrate an example of a conceptual configuration of the panel support member 30. FIG. 4 illustrates a plan view, and FIG. 5 illustrates the structure taken at a section X-X of FIG. 4. FIG. 4 illustrates part of the lower portion of the panel support member 30, and FIG. 5 illustrates the cover panel 2, the touch panel 130, and the display panel 120. The panel support member 30 is a member supporting the peripheral portion of the cover panel 2. In the example illustrated in FIG. 4, the panel support member 30 includes a plate part 31, support parts 32, a button arrangement part 33, and lateral parts 34.

The lateral parts 34 are respectively provided on both sides of the panel support member 30 in a short-length direction DR2. The lateral parts 34 are lateral portions 301 of the electronic apparatus 1 (see FIG. 1) and are part of the case 3. The panel support member 30 does not necessarily required to constitute the lateral portions 301 of the electronic apparatus 1. For example, the panel support member 30 may be accommodated in the electronic apparatus 1 without being exposed therefrom. In this case, the panel support member 30 may be directly fixed to the case 3 or may be directly fixed to other member (such as the cover panel 2) and fixed to the case 3 via the other member.

The plate part 31 has a plate shape and is disposed to face the cover panel 2. The touch panel 130 and the display panel 120 are located between the cover panel 2 and the plate part 31. That is, the plate part 31 faces the cover panel 2 with the touch panel 130 and the display panel 120 therebetween. The plate part 31 has an approximately rectangular shape in a plan view. The plate part 31 is desirably formed thin for a reduced thickness of the electronic apparatus 1. For example, the plate part 31 has a thickness comparable to or smaller than that of the display panel 120.

Referring to FIG. 5, the support parts 32 are vertically arranged on the peripheral edges on both sides of the plate part 31 in the short-length direction DR2 and project toward the cover panel 2. The support parts 32 are positioned outside of the touch panel 130 and the display panel 120 in a plan view, and are thus allowed to project toward the cover panel 2 while avoiding the touch panel 130 and the display panel 120. Meanwhile, the cover panel 2 extends beyond the touch panel 130 and the display panel 120, and accordingly, the support parts 32 abut against the peripheral edges (extended portions) of the cover panel 2 at the distal end thereof (end opposite to the plate part 31). Thus, the support parts 32 support the peripheral edges of the cover panel 2. The support parts 32 are fixed to the peripheral edges of the cover panel 2 with, for example, a double-sided tape or an adhesive. The technique of fixing the cover panel 2 by the support parts 32 is not limited to the technique above. As an example, in the case where a separate component having a screw hole is provided on the lateral surface of the cover panel 2 and a screw hole is provided in the support part 32 as well, the screw holes may be fixed together with a screw to fix the cover panel 2.

In the example illustrated in FIG. 2, the support parts 32 are vertically arranged not only on the both sides of the plate part 31 in the short-length direction DR2 but also on the peripheral edges on the both sides in the longitudinal direction DR1. For example, the support parts 32 are provided over the entire periphery on the peripheral edge of the plate part 31. This allows the support parts 32 to support the peripheral edge of the cover panel 2 over the entire periphery.

In the case where the support part 32 supports the cover panel 2 on the piezoelectric vibrating element 190 side (here, on the upper side, see FIG. 2), it is desirable that the portion of the cover panel 2 surrounding the piezoelectric vibrating element 190 should not be fixed to the support part 32. Accordingly, the vibration by the piezoelectric vibrating element 190 can be effectively transmitted to the cover panel 2. That is, the displacing of the cover panel 2 is not interrupted by the support part 32, and thus can easily vibrate according to the vibration of the piezoelectric vibrating element 190.

The support parts 32 provided on the both sides of the plate part 31 in the short-length direction DR2 are also respectively connected to the lateral parts 34. The lateral part 34 is located outside of the support part 32. The lateral part 34 projects toward the outer surface 20 of the cover panel 2 beyond the distal end of the support part 32 and forms a step shape together with the support part 32. The lateral part 34 faces the lateral surface of the cover panel 2 in the short-length direction DR2 and can function as a positioning part of the cover panel 2 in the short-length direction DR2.

The button arrangement part 33 is connected to the plate part 31 and is located below the plate part 31 in the longitudinal direction DR1. For example, referring to FIG. 2, the button arrangement part 33 is connected to the support part 32 on the lower side and is connected to the plate part 31 via the lower support part 32. As illustrated in FIG. 2, the button arrangement part 33 may project toward the outer surface 20 beyond the distal end of the lower support part 32 to form a step together with the lower support part 32. This allows the button arrangement part 33 to function as the positioning part of the cover panel 2 in the longitudinal direction DR1.

In the example illustrated in FIG. 2, a positioning part 321 is disposed above the support part 32 on the upper side. The positioning part 321 projects toward the outer surface 20 beyond the distal end of the upper support part 32 to form a step together with the upper portion of the support part 32. The positioning part 321 can define the position of the cover panel 2 in the longitudinal direction DR1.

The button arrangement part 33 has, for example, an approximately plate shape substantially parallel to the cover panel 2. The button arrangement part 33 has a plurality of (here, three) through-holes 331 provided along the short-length direction DR2. The through-holes 331 pass through the button arrangement part 33 in a normal direction DR3. The operation buttons 201 pass through the through-holes 331. The through-holes 331 can function as the positioning part of the operation button 201.

The portion of the plate part 31, mainly facing the display panel 120, may be made of a metal portion (such as stainless steel or aluminum). The metal plate has a rectangular shape long in, for example, the longitudinal direction DR1, and has a size large enough to face almost the entire region of the display panel 120. Such a metal plate can function as a shield that blocks an electromagnetic wave (an electric field and a magnetic field) from, for example, the touch panel 130 or the display panel 120.

The support part 32, the button arrangement part 33, and the lateral part 34 (or, as well as a portion of the plate part 31 other than the metal plate) may be formed of, for example, a resin such as a polycarbonate resin, an ABS resin, or a nylon-based resin. Those parts are, for example, integrally formed. As a result, a portion having a complicated shape can be produced easily.

The panel support member 30 as described above may be integrally formed of a metal plate and a resin by so-called double-molding.

<Reinforcing Part>

As described above, a plurality of through-holes 331 are formed along the short-length direction DR2 in the panel support member 30. Therefore, the button arrangement part 33 is prone to bending. That is, one end of the button arrangement part 33 in the short-length direction DR2 is supported, and a force in the normal direction DR3 is applied to the other end, so that the button arrangement part 33 is prone to bending compared to the structure with no through-hole 331. Hereinafter, the bending when one end in the short-length direction DR2 is supported and the force in the normal direction DR3 is applied to the other end is referred to as the bending in the short-length direction DR2. The same holds true for the bending in the longitudinal direction DR1.

The plate part 31 is connected to the button arrangement part 33 in the longitudinal direction DR1, and this eliminates or reduces the bending of the plate part 31 at a position close to the button arrangement part 33 unless the button arrangement part 33 does not bend. In an example embodiment, however, the button arrangement part 33 is relatively prone to bending, reducing the effect of eliminating or reducing the bending of the plate part 31.

The support part 32 is fixed to the cover panel 2, and accordingly, when a force is applied such that the electronic apparatus 1 bends in the short-length direction DR2, the cover panel 2 and the panel support member 30 bend substantially together. When the cover panel 2 can no longer withstand bending, cracking occurs in the cover panel 2.

The panel support member 30 and the cover panel 2 bend together in this manner, and thus, reducing an amount of bending of the panel support member 30 is effective for reducing an amount of bending of the cover panel 2. For this reason, the reinforcing part 35 extending in the short-length direction DR2 is formed in the plate part 31. The reinforcing part 35 is disposed near the button arrangement part 33. More specifically, the reinforcing part 35 is disposed at a position close to the button arrangement part 33 relative to the center of the plate part 31.

The reinforcing part 35 can improve the strength of the plate part 31. For example, the reinforcing part 35 has a projecting shape that it projects from the plate part 31. The reinforcing part 35 has a rib structure long in the short-length direction DR2, reducing an amount of bending of the plate part 31 in the short-length direction DR2. An amount of bending of the cover panel 2 that bends together with the panel support member 30 can be accordingly reduced. Therefore, an occurrence of cracking in the cover panel 2 can be eliminated or reduced.

For the plate part 31 formed of a metal plate, the reinforcing part 35 can has a recess/projection shape formed by drawing the metal plate. For example, the punch for forming the reinforcing part 35 is pushed (pressed) against a metal plate, thereby recessing the metal plate. When seen from the opposite side, the metal plate projects as a result of the pressing. The recess/projection functions as the reinforcing part 35. The metal plate can be easily drawn as described above, leading to easier manufacture.

The reinforcing part 35 may have, for example, a width larger than a half of the width of the plate part 31 in the short-length direction DR2. This can effectively reduce the bending of the plate part 31 in the short-length direction DR2.

The plate part 31 may have an appropriate number of through-holes. The through-holes pass through the plate part 31 in the normal direction DR3. Passing through the through-hole is, for example, a fastening member such as a screw that fixes the panel support member 30 and the case 3, or a harness, a printed wiring board, or the like that connects electrical parts, such as the display panel 120 and the control unit 100, disposed with the panel support member 30 therebetween. The through-holes may each have a cross-sectional area smaller than, for example, the cross-sectional area of the through-hole 331. In this case, the panel support member 30 is more prone to bending in the direction (here, the short-length direction DR2) in which a plurality of through-holes 331 having a relatively large cross-sectional area are disposed, and therefore, it can be explained that the reinforcing part 35 improves the strength of the plate part 31 in this direction.

In the example illustrated in FIG. 4, the reinforcing part 35 extends not along the longitudinal direction DR1 of the electronic apparatus 1 but along the short-length direction DR2, reducing bending in the short-length direction DR2. Here, considering an amount of bending of one beam as a simple structure, the amount of bending has a larger maximum value as the length of the beam increases. Thus, in the rectangular structure, the maximum value of the amount of bending in the longitudinal direction is larger than the maximum value of the amount of bending in the short-length direction. Thus, if the reinforcing part 35 is provided without any consideration for the through-holes 331, the reinforcing part 35 is provided to extend along the longitudinal direction DR1. In an example embodiment, however, since a plurality of through-holes 331 are provided along the short-length direction DR2 in the button arrangement part 33, the reinforcing part 35 extending not along the longitudinal direction DR1 but along the short-length direction DR2 is provided.

In the example illustrated in FIGS. 1 and 2, a plurality of operation buttons 201 are disposed below the cover panel 2. In other words, the operation buttons 201 are provided at positions different from the position of the cover panel 2 in a plan view, and do not face the cover panel 2. This eliminates the need for providing holes to allow the operation buttons 201 to pass through in the cover panel 2. This is particularly advantageous to the case where the cover panel 2, which is made of a high-hardness material such as sapphire, diamond, zirconia, titania, crystal, lithium tantalite, or aluminum oxynitride, is adopted as described above. This is because it is not easy to provide through-holes in the cover panel 2 having high hardness. For example, to drill the cover panel 2 for through-holes, the tool for drilling the cover panel 2 is susceptible to wear. Thus, the tool needs to be frequently replaced, increasing a manufacturing cost.

The button arrangement part 33 does not always need to be provided at a position different from that of the cover panel 2. For example, the cover panel 2 may extend to a more downward position, and through-holes for allowing a plurality of operation buttons 201 to pass therethrough may be formed. This allows the cover panel 2 having high hardness to protect the button arrangement part 33.

A plurality of operation buttons 201 need not to be provided, and it suffices to provide one operation button 201. In this case, one through-hole 202 is provided for the operation button 201. In this case, the extending direction of the reinforcing part 35 does not depend on the presence of the through-hole 202. As illustrated in FIG. 4, however, in the case where the through-holes 202 are provided near the end of the panel support part 30 in the longitudinal direction DR1, the panel support part 30 is prone to bending in the short-length direction DR2. In this case, accordingly, the reinforcing part 35 may extend along the short-length direction DR2. This can eliminate or reduce the bending of the panel support part 30 in the short-length direction DR2.

Figure 6:
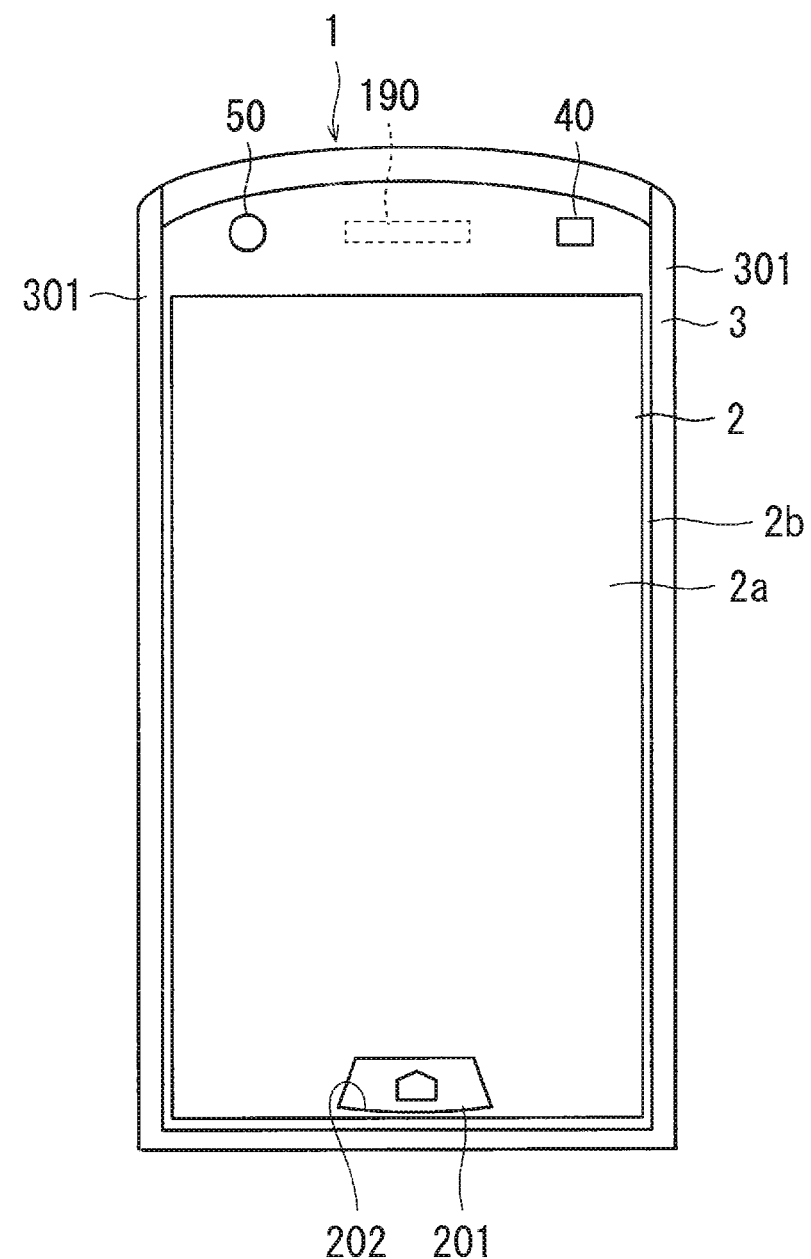
FIG. 6 is a front view illustrating an example of a conceptual configuration of the electronic apparatus.
Figure 7:
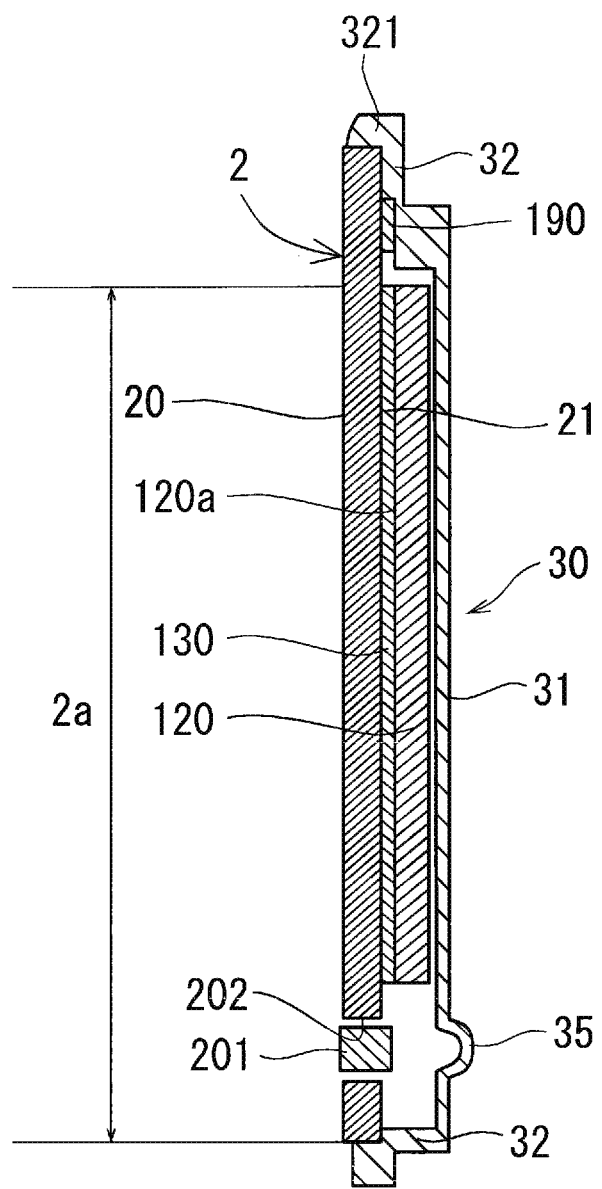
FIG. 7 is a cross-sectional view illustrating an example of a conceptual configuration of the cover panel, the touch panel, the display panel, and the panel support member.
Figure 7:
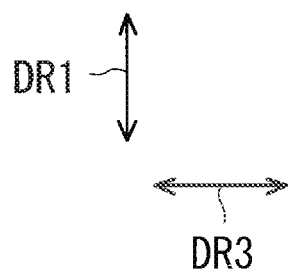
Figure 8:
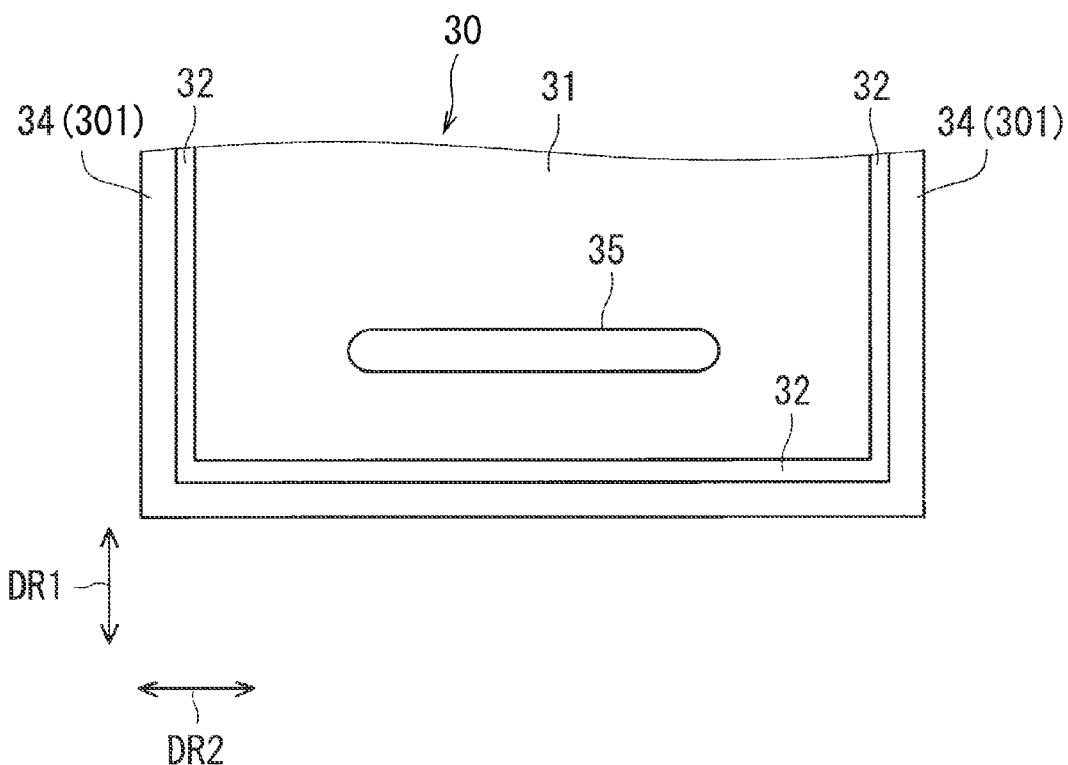
FIG. 8 is a plan view illustrating an example of a conceptual configuration of the panel support member.

FIG. 6 is a front view illustrating an external appearance of the electronic apparatus 1. In the example illustrated in FIG. 6, one operation button 201 is provided, and one through-hole 202 is provided for the operation button 20 in the cover panel 2. In this case, as illustrated in FIGS. 7 and 8, the panel support member 30 may have no through-hole for the operation button 201. In this case, accordingly, the panel support member 30 may include no button arrangement part 33. Also in such a case, the cover panel 2 is prone to bending particularly in the region in which the through-hole 202 is provided. As illustrated in FIGS. 7 and 8, thus, the reinforcing part 35 is provided in the plate part 31. In the example illustrated in FIG. 6, the operation button 201 is located on one side, for example, the lower side, relative to the center of the cover panel 2 in a plan view. In this case, it suffices that the reinforcing part 35 is also provided on the one side relative to the center in a plan view. This eliminates or reduces the bending of the plate part 31, and accordingly, also eliminates or reduces the bending of the cover panel 2 that bends together with the plate part 31. The center described above can be recognized as the center of the panel support member 30.

In the example illustrated in FIG. 6, the through-hole 202 is provided near the end of the cover panel 2 in the longitudinal direction DR1. Thus, the cover panel 2 is prone to bending near the end in the short-length direction DR2. As illustrated in FIG. 8, accordingly, the reinforcing part 35 may extend along the short-length direction DR2. This can eliminate or reduce the bending of the cover panel 2 that bends together with the plate part 31 in the short-length direction DR2 as well.

Also in the configuration of FIG. 6, a plurality of operation buttons 201 may be disposed side by side along a predetermined direction and a plurality of through-holes 202 corresponding thereto may be disposed side by side along the predetermined direction, such as the short-length direction DR2. In this case, the reinforcing part 35 may extend along the predetermined direction, such as the short-length direction DR2.

The reinforcing part 35 may be formed at a position close to the through-hole 202 relative to the center of the plate part 31. Further, the reinforcing part 35 may be formed at such a position as to face the through-hole 202. This results in that the reinforcing part 35 is provided correspondingly to the region in which the reinforcing part 35 is prone to bending in the short-length direction DR2, effectively eliminating or reducing the bending of the cover panel 2 in the short-length direction DR2.

The support part 32 is in direct contact with the cover panel 2 in the example described above, which is not always limited thereto. In the case where other member is provided in the peripheral portion of the cover panel 2, the support part 32 may support the cover panel 2 with the other member therebetween.

In the example illustrated in FIG. 7, the reinforcing part 35 has a recess/projection shape by drawing, and projects toward the side opposite to the cover panel 2. Accordingly, the plate part 31 is recessed in the reinforcing part 35 when seen from the cover panel 2 side, whereas the plate part 31 projects in the reinforcing part 35 when seen from the side opposite to the cover panel 2. Therefore, the portion in which the reinforcing part 35 is provided and the portion in which the reinforcing part 35 is not provided in the plate part 31 forms a step.

Figure 9:
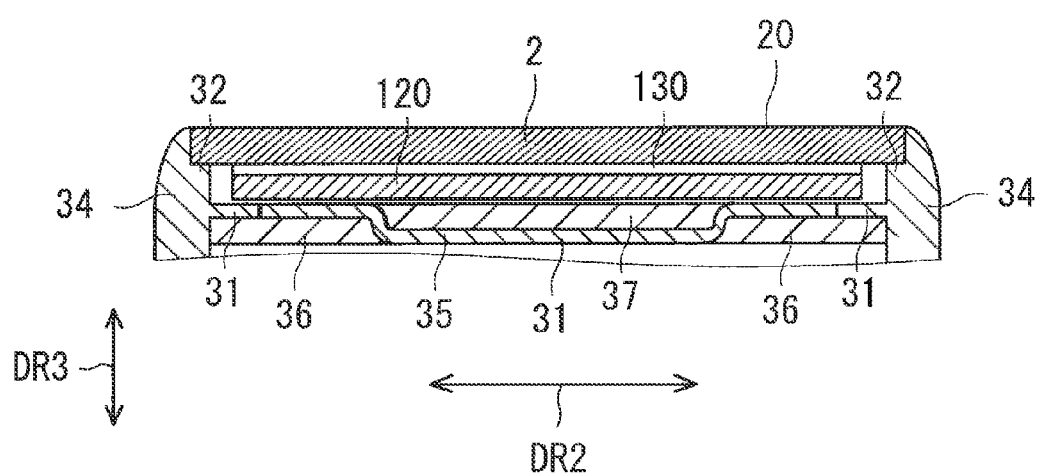
FIG. 9 is a cross-sectional view illustrating an example of a conceptual configuration of the cover panel, the touch panel, the display panel, and the panel support member.

Thus, as illustrated in FIG. 9, resin parts 36 and 37 may be provided. The resin part 36 is provided on the side opposite to the cover panel 2 relative to the plate part 31, and fills the step of the plate part 31. That is, the resin part 36 is provided at the position where the reinforcing part 35 is not provided in the plate part 31, and is adjacent to the reinforcing part 35 in the direction parallel to the cover panel 2. The resin part 37 is provided on the side close to the cover panel 2 relative to the plate part 31, and fills the step of the plate part 31. That is, the resin part 37 is provided at the position where the reinforcing part 35 is provided in the plate part 31, and is adjacent to the reinforcing part 35 in the direction parallel to the cover panel 2.

The resin parts 36 and 37 may be, for example, a polycarbonate resin, an ABS resin, a nylon-based resin, or a polyethylene terephthalate. The resin parts 36 and 37 are provided in close contact with, for example, the plate part 31. For example, the resin parts 36 and 37 and the panel support member 30 are integrally formed.

The resin parts 36 and 37 can improve the strength of the plate part 31. This reduces an amount of bending of the plate part 31, eliminating or reducing the cracking of the cover panel 2.

The resin parts 36 and 37 may be both provided in the example illustrated in FIG. 9, and any one of them may be provided.

Figure 10:
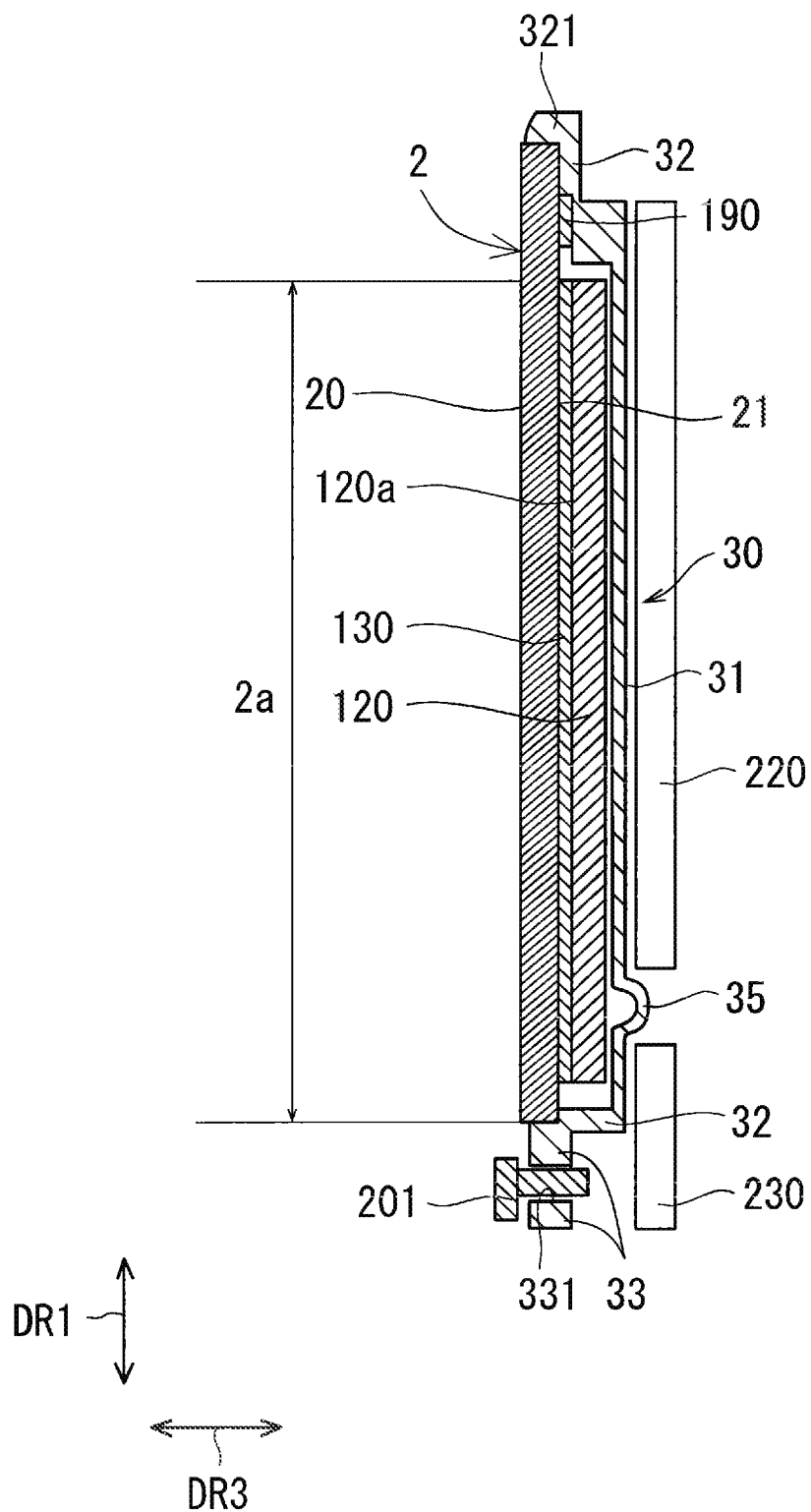
FIG. 10 is a cross-sectional view illustrating an example of a conceptual configuration of the cover panel, the touch panel, the display panel, and the panel support member.

The example of FIG. 10 illustrates components 220 and 230. The component 220 is, for example, the battery 210. The component 230 is, for example, a connection part to be connected with an external terminal, such as a headphone connector. The components 220 and 230 are provided on the side, on which the reinforcing part 35 projects, relative to the plate part 31 (here, the side opposite to the cover panel 2) and are, for example, adjacently provided. More specifically, the components 220 and 230 are adjacently provided with a distance therebetween in the direction DR1. The reinforcing part 35 is located between the components 220 and 230. In other words, the reinforcing part 35 projects up to the region between the components 220 and 230.

With the above-mentioned configuration, the space in the electronic apparatus 1 can be effectively used. Unlike the example illustrated in, for example, FIG. 10, when the components 220 and 230, which are continuous from each other in the direction DR1, are disposed so as not to interfere with the reinforcing part 35, the components 220 and 230 are disposed with a distance from the plate part 31 on the side in which the reinforcing part 35 projects. In this case, an unnecessary space is produced between the components 220 and 230 and the plate part 31. In the example illustrated in FIG. 10, meanwhile, the components 220 and 230 are apart from each other, and the reinforcing part 35 is located therebetween. In this structure, the components 220 and 230 do not interfere with the reinforcing part 35, and accordingly can be disposed close to the plate part 31. This reduces an unnecessary space, contributing to a smaller size of the electronic apparatus 1.

If the space between the component 220 and the plate part 31 is narrow, the plate part 31 abuts against the component 220 by a small amount of bending when the plate part 31 bends. Accordingly, the plate part 31 is supported by the component 220, reducing a further bending of the plate part 31. This can contribute to eliminating or reducing of the cracking of the cover panel 2. The same also holds true for the component 230.

The components 220 and 230 are disposed to face each other in the direction DR1 in the example illustrated in FIG. 10, which may be disposed in the direction DR2 in an offset manner. Also in this case, the component 220 is located on one side (upper side) in the direction DR1 relative to the reinforcing part 35, whereas the component 230 is located on the other side (lower side) in the direction DR2 relative to the reinforcing part 35. Thus, when seen along the direction DR2, the reinforcing part 35 is located between the components 220 and 230.

The relation among the piezoelectric vibrating element 190, the cover panel 2, and the reinforcing part 35 will be described below. First, the piezoelectric vibrating element 190 will be described in detail.

<Details of Piezoelectric Vibrating Element>

Figure 11:
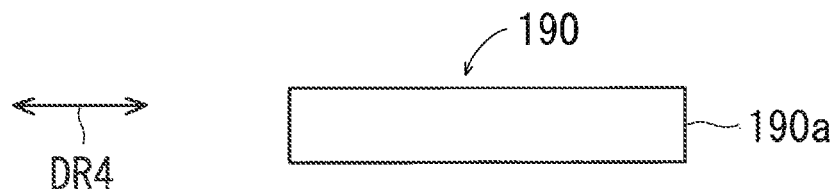
FIG. 11 is a top view illustrating a structure of a piezoelectric vibrating element.
Figure 12:
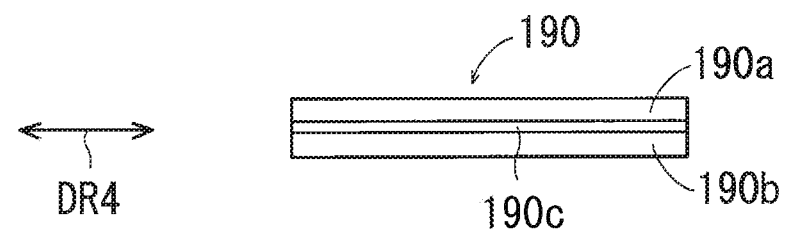
FIG. 12 is a side view illustrating the structure of the piezoelectric vibrating element.

FIGS. 11 and 12 illustrate a top view and a side view, respectively, of a structure of the piezoelectric vibrating element 190. As illustrated in FIGS. 7 and 8, the piezoelectric vibrating element 190 has a long shape in one direction. Specifically, the piezoelectric vibrating element 190 has a long and narrow rectangular plate shape in a plan view. The piezoelectric vibrating element 190 has, for example, a bimorph structure. The piezoelectric vibrating element 190 includes a first piezoelectric ceramic plate 190a and a second piezoelectric ceramic plate 190b which are bonded to each other through a shim material 190c.

In the piezoelectric vibrating element 190, when a positive voltage is applied to the first piezoelectric ceramic plate 190a and a negative voltage is applied to the second piezoelectric ceramic plate 190b, the first piezoelectric ceramic plate 190a extends along a longitudinal direction DR4 and the second piezoelectric ceramic plate 190b contracts along the longitudinal direction DR4. The longitudinal direction DR4 is a longitudinal direction of the piezoelectric vibrating element 190. Here, the piezoelectric vibrating element 190 is disposed with the longitudinal direction DR4 extending along the short-length direction DR2, and thus, the longitudinal direction DR4 corresponds to the short-length direction DR2.

Through the operations of the first piezoelectric ceramic plate 190a and the second piezoelectric ceramic plate 190b as described above, as illustrated in FIG. 13, the piezoelectric vibrating element 190 is bent into a convex shape with the first piezoelectric ceramic plate 190a being outside.

In contrast, in the piezoelectric vibrating element 190, when a negative voltage is applied to the first piezoelectric ceramic plate 190a and a positive voltage is applied to the second piezoelectric ceramic plate 190b, the first piezoelectric ceramic plate 190a contracts along the longitudinal direction DR4 and the second piezoelectric ceramic plate 190b extends along the longitudinal direction DR4. Accordingly, as illustrated in FIG. 14, the piezoelectric vibrating element 190 is bent into a convex shape with the second piezoelectric ceramic plate 190b being outside.

Figure 13:
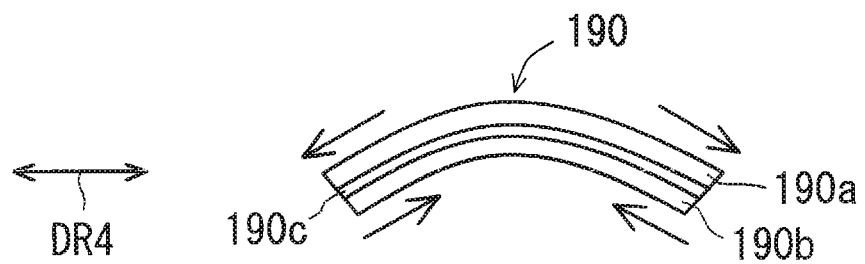
FIG. 13 is a view illustrating a state where the piezoelectric vibration element vibrates while being bent.
Figure 14:
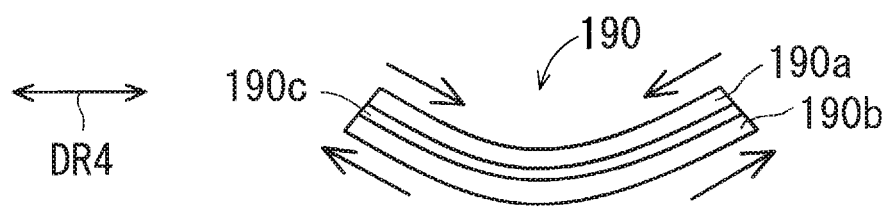
FIG. 14 is a view illustrating a state where the piezoelectric vibration element vibrates while being bent.

The piezoelectric vibrating element 190 vibrates while being bent along the longitudinal direction DR4 by alternately taking the states of FIG. 13 and FIG. 14. The control unit 100 allows the piezoelectric vibrating element 190 to vibrate while being bent along the longitudinal direction by applying an alternating circuit (AC) voltage in which the positive voltage and the negative voltage alternately appear at an area between the first piezoelectric ceramic plate 190a and the second piezoelectric ceramic plate 190b.

Only one structure made of the first piezoelectric ceramic plate 190a and the second piezoelectric ceramic plate 190b, which are bonded to each other with the shim material 190 therebetween, is provided in the piezoelectric vibrating element 190 illustrated in FIGS. 11 to 14. Alternatively, a plurality of the structures may be laminated to each other.

The piezoelectric vibrating element 190 having such a structure is disposed on the peripheral end of the inner surface 21 of the cover panel 2, as illustrated in FIG. 1 and FIG. 2. Specifically, the piezoelectric vibrating element 190 is disposed in a central portion in the short-length direction DR2 in the upper end of the inner surface 21 of the cover panel 2. The piezoelectric vibrating element 190 is disposed such that the longitudinal direction DR4 thereof extends along the short-length direction DR2 of the cover panel 2. In this manner, the piezoelectric vibrating element 190 vibrates while being bent along the short-length direction DR2 of the cover panel 2. Further, the center of the piezoelectric vibrating element 190 in the longitudinal direction DR4 corresponds to the center in the short-length direction DR2 in the upper end of the inner surface 21 of the cover panel 2.

As illustrated in FIG. 13 and FIG. 14, the center of the piezoelectric vibrating element 190 in the longitudinal direction DR4 has the largest displacement amount when the piezoelectric vibrating element 190 is vibrating. Accordingly, an area in the center in the short-length direction DR2 in the upper end of the inner surface 21 of the cover panel 2, which corresponds to the position of the piezoelectric vibrating element, has the largest displacement amount of bending and vibrating.

Only one structure made of the first piezoelectric ceramic plate 190a and the second piezoelectric ceramic plate 190b, which are bonded to each other with the shim material 190c therebetween, is provided in the piezoelectric vibrating element 190 illustrated in FIGS. 11 to 14. However, a plurality of the structures may be laminated to each other. The laminated structure preferably has 28 or more layers, more preferably has 44 or more layers because vibrations can be sufficiently transmitted to the cover panel 2.

Further, the piezoelectric vibrating element 190 may be made of organic piezoelectric materials such as polyvinylidene fluoride and polylactic acid in addition to the piezoelectric ceramic materials. For example, the piezoelectric vibrating element 190 is configured such that films made of polylactic acid are used as a first piezoelectric plate and a second piezoelectric plate and they are laminated to each other. In addition, in regard to an electrode, a transparent electrode such as Indium-Tin-Oxide (that is, indium tin oxide, ITO) is possible to be used.

<Generation of Reception Sound>

In the electronic apparatus 1 according to an example embodiment, the piezoelectric vibrating element 190 is provided on one side (upper side) of the cover panel 2 in the longitudinal direction DR1 (an example of the perpendicular direction). The piezoelectric vibrating element 190 vibrates the cover panel 2, so that the air conduction sound and the conduction sound are transmitted from the cover panel 2 to the user. In other words, the vibration of the piezoelectric vibrating element 190 itself is transmitted to the cover panel 2, so that the air conduction sound and the conduction sound are transmitted to the user from the cover panel 2.

Here, the term "air conduction sound" means a sound recognized by a human brain by the vibration of an eardrum due to a sound wave (air vibration) which enters an external auditory meatus hole (a so-called "ear hole"). On the other hand, the term "conduction sound" is a sound recognized in a human brain by the vibration of the eardrum due to the vibration of an auricle transmitted to the eardrum. Hereinafter, the air conduction sound and the conduction sound will be described in detail.

Figure 15:
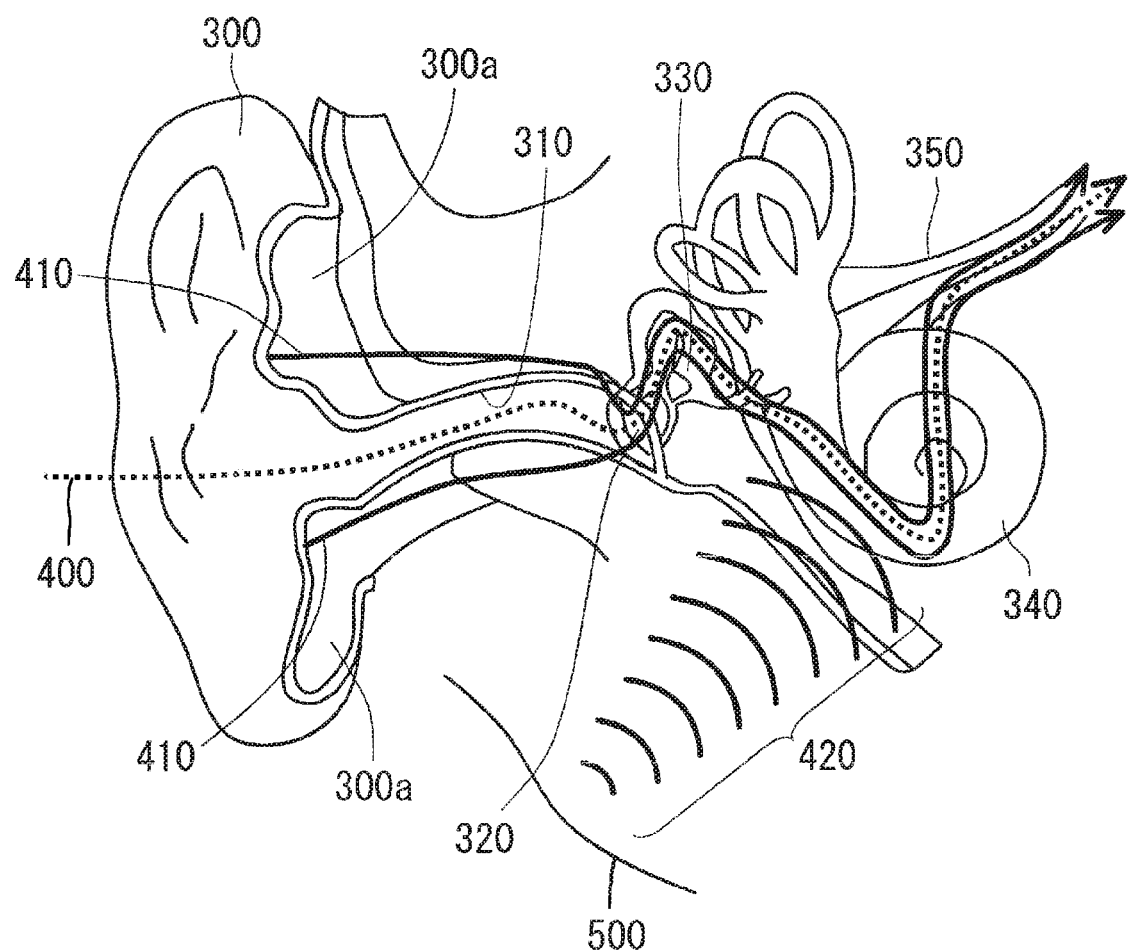
FIG. 15 is a view for describing the air conduction sound and the conduction sound.

FIG. 15 is a view for describing the air conduction sound and the conduction sound. FIG. 15 illustrates a structure of an ear of the user of the electronic apparatus 1. In FIG. 15, a dotted line 400 indicates a conduction path of a sound signal (sound information) of the air conduction sound. A solid line 410 indicates the conduction path of the sound signal of the conduction sound.

When the piezoelectric vibrating element 190 mounted on the cover panel 2 vibrates based on the electric sound signal indicating the reception sound, the cover panel 2 vibrates, and a sound wave is output from the cover panel 2. When the user moves the cover panel 2 of the electronic apparatus 1 close to an auricle 300 of the user by holding the electronic apparatus 1 in a hand, or the cover panel 2 of the electronic apparatus 1 is set to (brought into contact with) the auricle 300 of the user, the sound wave output from the cover panel 2 enters an external auditory meatus hole 310. The sound wave from the over panel 2 enters in the external auditory meatus hole 310 and the eardrum 320, and the eardrum 320 vibrates. The vibration of the eardrum 320 is transmitted to an auditory ossicle 330 and the auditory ossicle 330 vibrates. In addition, the vibration of the auditory ossicle 330 is transmitted to a cochlea 340 and is converted into an electrical signal in the cochlea 340. The electrical signal is transmitted to the brain by passing through an acoustic nerve 350 and the reception sound is recognized in the brain. In this manner, the air conduction sound is transmitted from the cover panel 2 to the user.

Further, when the user puts the cover panel 2 of the electronic apparatus 1 to the auricle 300 of the user by holding the electronic apparatus 1 in a hand, the auricle 300 is vibrated by the cover panel 2, which cover panel 2 is vibrated by the piezoelectric vibrating element 190. The vibration of the auricle 300 is transmitted to the eardrum 320, and thus the eardrum 320 vibrates. The vibration of the eardrum 320 is transmitted to the auditory ossicle 330, and thus the auditory ossicle 330 vibrates. The vibration of the auditory ossicle 330 is transmitted to the cochlea 340 and is converted into an electrical signal in the cochlea 340. The electrical signal is transmitted to the brain by passing through the acoustic nerve 350 and the reception sound is recognized in the brain. In this manner, the conduction sound is transmitted from the cover panel 2 to the user. FIG. 15 illustrates an auricular cartilage 300a in the inside of the auricle 300.

Bone conduction sound is a sound recognized in a human brain by the vibration of the skull and direct stimulation of the inner ear such as the cochlea caused by the vibration of the skull. In FIG. 15, in a case of vibrating a jawbone 500, the transmission path of the sound signal while the bond conduction sound is recognized in the brain is indicated with a plurality of arcs 420.

As described above, the air conduction sound and the conduction sound can be transmitted from the cover panel 2 to the user of the electronic apparatus 1 due to the vibration of the cover panel 2 through the vibration of the piezoelectric vibrating element 190. The user can hear the air conduction sound from the cover panel 2 by moving the cover panel 2 close to an ear (auricle). Further, the user can hear the air conduction sound and the conduction sound from the cover panel 2 by bringing the cover panel 2 into contact with an ear (auricle). The structure of the piezoelectric vibrating element 190 according to an example embodiment is contrived to appropriately transmit the air conduction sound and the conduction sound to the user. Various advantages are achieved by configuring the electronic apparatus 1 to transmit the air conduction sound and the conduction sound to the user.

Since the user can hear a sound when the user puts the cover panel 2 to an ear, communication using the electronic apparatus 1 can be performed without much concerning regarding the position of the electronic apparatus 1 with respect to the ear.

In addition, since the user can hear the conduction sound due to the vibration of the auricle, it easy for the user to hear the sound even when there is a large amount of ambient noise. Accordingly, the user can appropriately perform communication even when there is a large amount of the ambient noise.

In addition, even with earplugs or earphones on his/her ears, the user can recognize the reception sound from the electronic apparatus 1 by setting the cover panel 2 to the ear (more specifically, the auricle). Further, with headphones on his/her ears, the user can recognize the reception sound from the electronic apparatus 1 by putting the cover panel 2 to the headphones.

The portion of the cover panel 2, on which the piezoelectric vibrating element 190 is mounted, is vibrated with relative ease. Thus, the user can easily hear the sound from the cover panel 2 by moving an upper end (particularly, a central portion of the upper end in the short-length direction DR2) of the cover panel 2, on which the piezoelectric vibrating element 190 is mounted, close to an ear or holding the portion to an ear.

<Cover Panel>

Next, the cover panel 2 suitable for the piezoelectric vibrating element 190 that vibrates while being bent along the longitudinal direction DR4 (short-length direction DR2) will be described. In an example embodiment, the first surface (inner surface) 20 and the second surface (outer surface) 21 of the cover panel 2 are parallel to an a-plane of a sapphire. The longitudinal direction DR1 of the cover panel 2 is parallel to a c-axis of the sapphire. The short-length direction DR2 of the cover panel 2 is parallel to an m-axis of the sapphire. The m-axis is parallel to the a-plane and is perpendicular to the c-axis.

The sapphire has an anisotropic crystal structure. The sapphire having a plane parallel to the a-plane is more prone to bending in the direction parallel to the m-axis than in the direction parallel to the c-axis, due to its anisotropic crystal structure.

Figure 16:
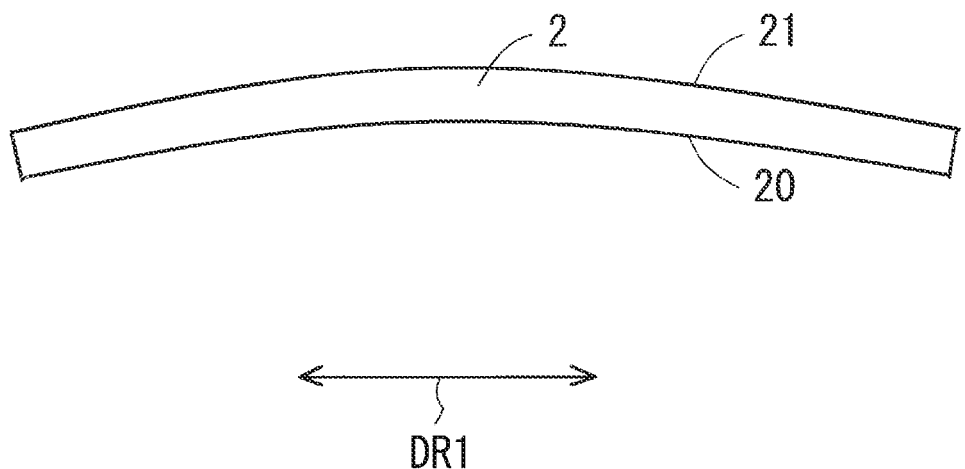
FIG. 16 is a view illustrating a state where a cover member bends in a longitudinal direction.
Figure 17:
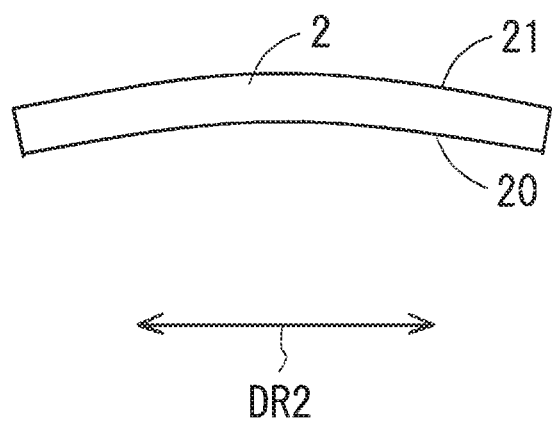
FIG. 17 is a view illustrating a state where the cover member bends in a short-length direction.

In an example embodiment, the first surface 20 and the second surface 21 of the cover panel 2 are parallel to the a-plane of the sapphire, and the longitudinal direction DR1 of the cover panel 2 is parallel to the c-axis of the sapphire. Accordingly, from the viewpoint of an anisotropic crystal structure of the sapphire, the cover panel 2 is more prone to bending (is more likely to be curved) in the short-length direction DR2 than in the longitudinal direction DR1. FIG. 16 illustrates a state where the cover panel 2 bends in the longitudinal direction DR1. FIG. 17 illustrates a state where the cover panel 2 bends in the short-length direction DR2. The results of the tests for checking how easily the sapphire bends will be described below.

Figure 18:
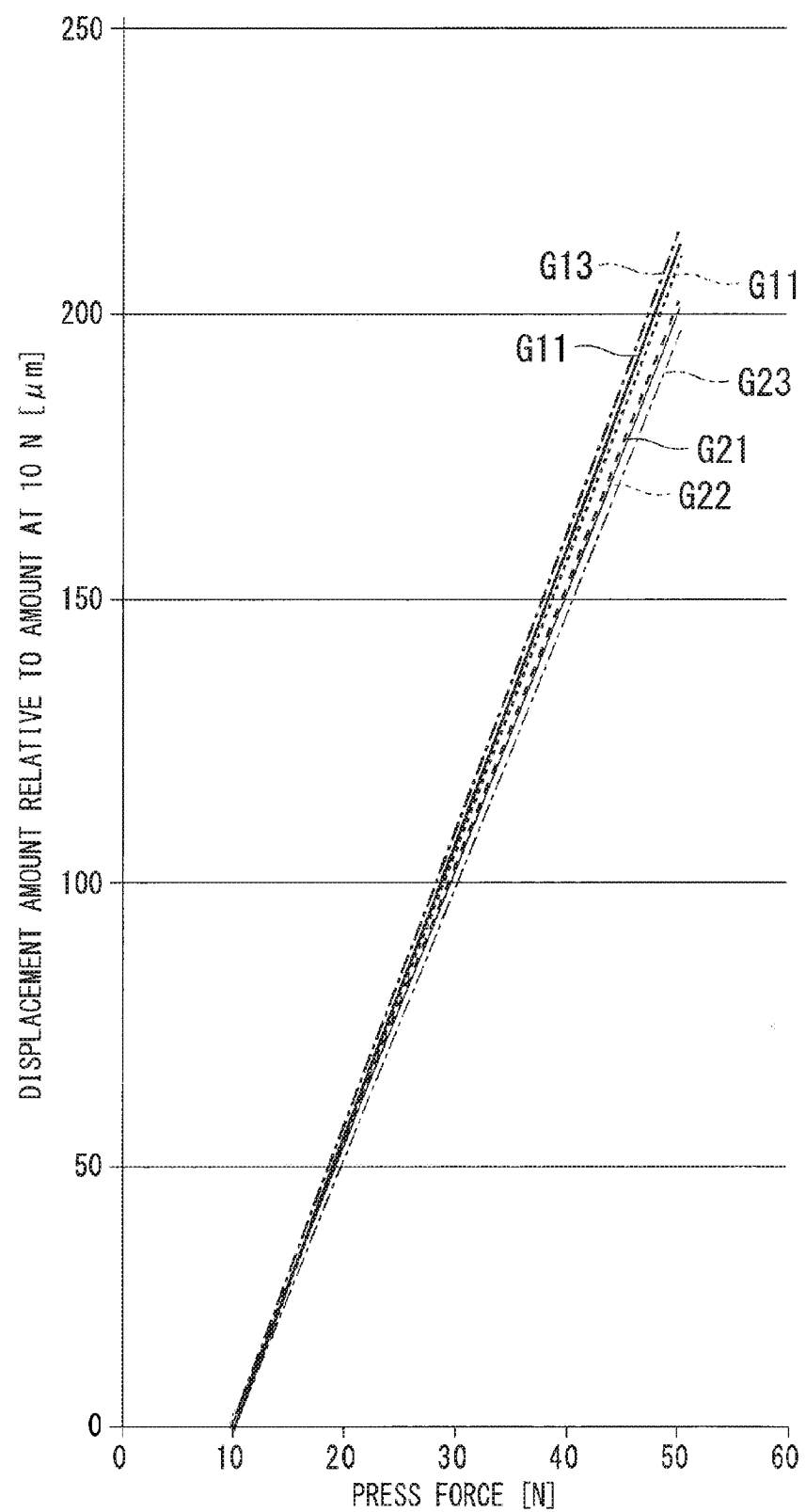
FIG. 18 is a graph illustrating the results of tests of checking how easily a sample panel bends.
Figure 19:
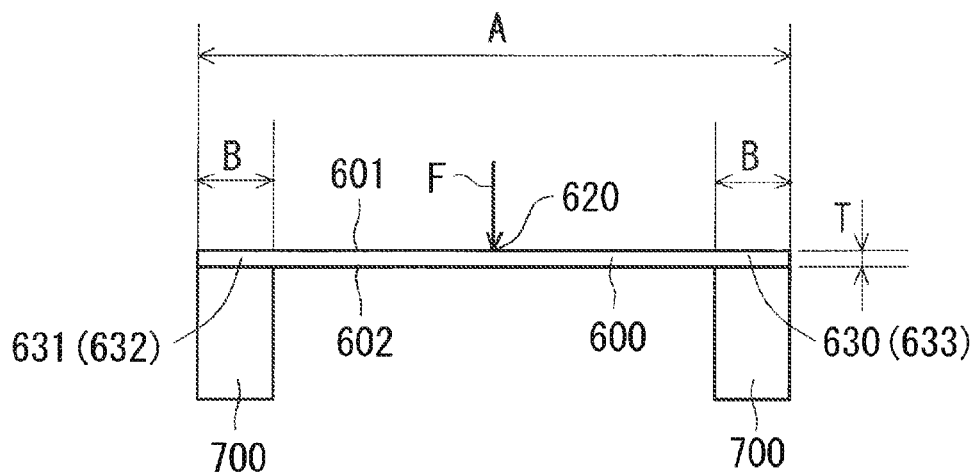
FIG. 19 is a view for describing a method for the tests of checking how easily the sample panel bends.
Figure 20:
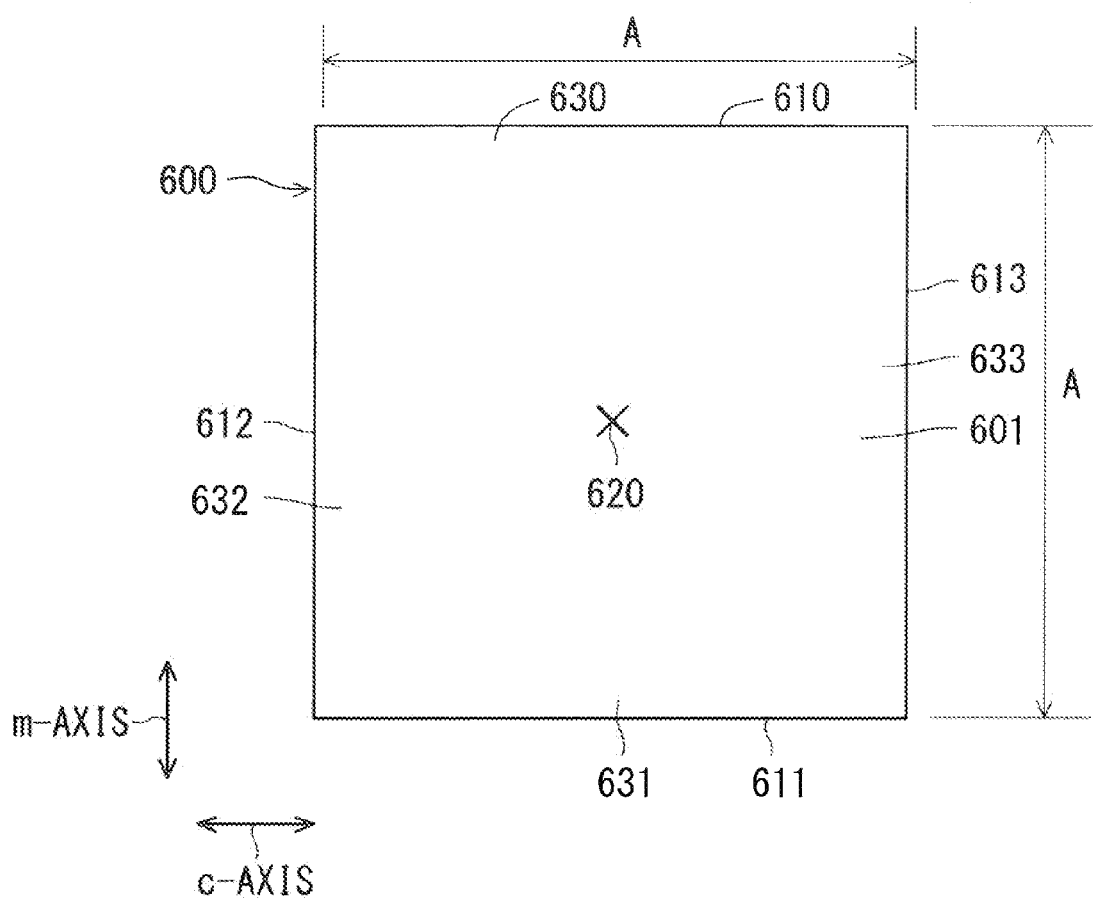
FIG. 20 is a plan view illustrating the sample panel.

FIG. 18 is a graph illustrating the results of tests of checking how easily a sample panel 600 made of sapphire bends (hereinafter, referred to as "bending check tests"). FIG. 19 is a view for describing the method for bending check tests. FIG. 20 illustrates a plan view of the sample panel 600.

As illustrated in FIGS. 19 and 20, the sample panel 600 has a first surface 601 and a second surface 602 opposite thereto and has a square shape. A length A of one side of the sample panel 600 is 62 mm, and a thickness T of the sample panel 600 is 0.475 mm.

The first surface 601 and the second surface 602 are parallel to the a-plane of the sapphire. A pair of sides 610 and 611, parallel to each other, of the sample panel 600 is parallel to the c-axis of the sapphire. A pair of sides 612 and 613, parallel to each other, of the sample panel 600 is parallel to the m-axis perpendicular to the c-axis.

In the bending check tests, as illustrated in FIG. 19, the sample panel 600 is placed on an iron pedestal 700. In this case, the sample panel 600 is merely provided on the pedestal 700 and is not fixed thereto. A displacement amount of a central portion 620 of the sample panel 600 on the pedestal 700, obtained when a press force F is applied to the central portion 620, is measured. The press force F is applied to the central portion 620 of the sample panel 600 when a rod-shape member is pressed against the central portion 620. In the bending check tests, the press force F is changed at a constant rate, and a displacement amount of the central portion 620 of the sample panel 600, obtained in application of each press force F, is measured. A rate of change of the press force F is 5 N/sec. Hereinafter, the displacement amount of the central portion 620 is simply referred to as a "displacement amount."

In the bending check tests, a displacement amount when the sample panel 600 bends in the direction parallel to the m-axis (hereinafter, referred to as a "first displacement amount") and a displacement amount when the sample panel 600 bends in the direction parallel to the c-axis (hereinafter, referred to as a "second displacement amount") are measured. In the measurement of the first displacement amount, the press force F is applied to the central portion 620 of the sample panel 600 in a state where an end 630 of the sample panel 600, which has a width B including the side 610, and an end 631 of the sample panel 600, which has the width B including the side 611, are supported on the pedestal 700. The width B is set to 12.5 mm. In the measurement of the second displacement amount, the press force F is applied to the central portion 620 of the sample panel 600 in a state where an end 632 of the sample panel 600, which has the width B including the side 612, and an end 633 of the sample panel 600, which has the width B including the side 613, are supported on the pedestal 700.

FIG. 18 illustrates the first and second displacement amounts when the press force F is changed from 10 N to 50 N. The horizontal axis of FIG. 18 indicates the press force F, and the vertical axis of FIG. 18 indicates the first and second displacement amounts relative to a value obtained with the press force F of 10 N. Graphs G11, G12, and G13 illustrated in FIG. 18 indicate approximation straight lines of the first, second, and third measurement results, respectively, of the first displacement amount. Graphs G21, G22, and G23 indicate approximation straight lines of the first, second, and third measurement results, respectively, of the second displacement amount.

As illustrated in FIG. 18, the slopes of the graphs G11, G12, and G13 indicating the first displacement amount are larger than the slopes of the graphs G21, G22, and G23 indicating the second displacement amount. This means that the square sample panel 600 is more prone to bending in the direction parallel to the m-axis than in the direction parallel to the c-axis. Thus, it can be said that the sapphire having a plane parallel to the a-plane is more prone to bending in the direction parallel to the m-axis than in the direction parallel to the c-axis due to its anisotropic crystal structure.

As described above, from the viewpoint of the anisotropic crystal structure of the sapphire, the cover panel 2 according to example embodiment is more prone to bending in the short-length direction DR2 than in the longitudinal direction DR1. In other words, the cover panel 2 is more prone to bending in the short-length direction DR2 than in the longitudinal direction DR1 in terms of its crystal structure. As described above, the piezoelectric vibrating element 190 vibrates while being bent along the short-length direction DR2 of the cover panel 2. Accordingly, the cover panel 2 is more prone to vibration by the piezoelectric vibrating element 190 vibrating while being bent. As a result, the air conduction sound and the conduction sound (reception sound) are easily transmitted to the user.

In terms of the anisotropic crystal structure of the sapphire, just because the cover panel 2 is more prone to bending in the short-length direction DR2 than in the longitudinal direction DR1, the cover panel 2 is not necessarily more prone to bending in the short-length direction DR2 than in the longitudinal direction DR1 from an objective standpoint. Likewise, in terms of its shape, just because the cover panel 2 is more prone to bending in the longitudinal direction DR1 than in the short-length direction DR2, the cover panel 2 is not necessarily more prone to bending in the longitudinal direction DR1 than in the short-length direction DR2 from an objective standpoint.

Although only one piezoelectric vibrating element 190 is provided in the example above, a plurality of piezoelectric vibrating elements 190 may be provided on the inner surface 21 of the cover panel 2. For example, a plurality of piezoelectric vibrating elements 190 are disposed side by side along the short-length direction DR2 of the cover panel 2. Each of the piezoelectric vibrating elements 190 is disposed such that its longitudinal direction DR4 extends along the short-length direction DR2 of the cover panel 2.

<Reinforcing Part>

In the example above, the piezoelectric vibrating element 190 is provided to the portion on one side (upper side) of the cover panel 2 in the longitudinal direction DR1. Here, the portion on one side refers to the potion on one side relative to the center of the cover panel 2. In contrast, the reinforcing part 35 is provided at the position opposite to the portion on the other side (lower side) of the cover panel 2. The reinforcing part 35 extends along the short-length direction DR2 in which the cover panel 2 is prone to bending in terms of anisotropic crystal structure.

In short, by adopting the cover panel 2 that is prone to bending in the short-length direction DR2 in terms of crystal structure, the portion on the piezoelectric vibrating element 190 side is prone to vibration while being bent. Additionally, by providing the reinforcing part 35 correspondingly to the portion on the lower side (the side opposite to the piezoelectric vibrating element 190) of the cover panel 2, the cracking of the cover panel 2 is eliminated or reduced.

From this viewpoint, in the case where the reinforcing part 35 is also provided on the side close to the piezoelectric vibrating element 190 relative to the center of the plate part 31, the length of the reinforcing part 35 in the short-length direction DR2 may be set smaller than the length of the reinforcing part 35, which is provided on the button arrangement part 33 side, in the short-length direction DR2. This can eliminate or reduce the bending in the short-length direction DR2 of the portion (the portion on the button arrangement part 33 side) whose bending in the short-length direction DR2 is to be eliminated or reduced.

While the example in which embodiments of the present disclosure are applied to a mobile phone has been described, embodiments of the present disclosure are applicable to any devices having the function of causing a cover member to vibrate while being vibrated by a vibrating part. Embodiments of the present disclosure are applicable to, for example, tablet terminals, watches, glasses, headphones, hairpieces, belts, portable recorders, portable players, or the like in addition to mobile phones such as smartphones.

While the electronic apparatus 1 has been described in detail, the foregoing description is in all aspects illustrative and not restrictive. The embodiment and modifications described above may be combined with one another, as long as they are not mutually exclusive. It is therefore understood that numerous modifications and variations can be devised without departing from the scope of embodiments of the present disclosure.

The invention claimed is:

1. An electronic apparatus comprising:
 a cover panel that is located on a surface of said electronic apparatus;
 a panel support member including a through-hole, a plate part opposed to said cover panel, support parts that are vertically arranged on both sides of said plate part and support said cover panel, and a reinforcing part that is located in said plate part and reinforces said plate part, wherein the reinforcing part comprises a recess on a first side of the plate part and a corresponding projection on a second side of the plate part that is opposite the first side; and
 an operation button that passes through said through-hole.

2. The electronic apparatus according to claim 1, wherein said at least one through-hole includes a plurality of through-holes, said plurality of through-holes being disposed side by side along a predetermined direction, said support parts are vertically arranged on both sides of said plate part in said predetermined direction, and said reinforcing part extends along said predetermined direction.

3. The electronic apparatus according to claim 1, wherein said plate part includes a metal portion made of metal, and said reinforcing part is formed by drawing of said metal portion.

4. The electronic apparatus according to claim 1, further comprising a resin that fills a step formed by said reinforcing part in said plate part.

5. The electronic apparatus according to claim 1, further comprising a first component and a second component provided on the second side of said plate part, wherein said projection of said reinforcing part is located between said first component and said second component.

6. The electronic apparatus according to claim 2, wherein said reinforcing part is located at a position between said at least one through-hole and a center of said plate part.

7. The electronic apparatus according to claim 6, further comprising
 a vibrating part that is located in a portion on one side of said cover panel in a perpendicular direction parallel to said cover panel and perpendicular to said predetermined direction, and vibrates while being bent along said predetermined direction,
 wherein
  said cover panel has anisotropy in crystal structure and, in terms of said anisotropy, is prone to bending in said predetermined direction and is resistant to bending in said perpendicular direction, and
  said reinforcing part is located at such a location as to face a portion on the other side of said cover panel in said perpendicular direction.

8. The electronic apparatus according to claim 2, wherein said cover panel and said panel support member have a rectangular shape in which said predetermined direction is a short-length direction.

9. The electronic apparatus according to claim 4, wherein said resin fills the recess on the first side of the plate part.

10. The electronic apparatus according to claim 9, wherein said resin also fills spaces on both sides of the projection on the second side of the plate part.

11. The electronic apparatus according to claim 1, wherein the first side of the plate part is a side facing the cover panel, and wherein the second side of the plate part is a side facing away from the cover panel.

12. The electronic apparatus according to claim 1, wherein the cover panel comprises sapphire.

* * * * *